United States Patent [19]
Beery et al.

[11] Patent Number: 5,805,613
[45] Date of Patent: Sep. 8, 1998

[54] METHODS FOR EFFICIENT BOUNDED-DISTANCE DECODING OF THE HEXACODE AND ASSOCIATED DECODERS FOR THE LEECH LATTICE AND THE GOLAY CODE

[75] Inventors: Yair Beery, Petach Tikva; Ofer Amrani, Tel Aviv, both of Israel

[73] Assignee: Ramot University Authority for Applied Research & Industrial Development Ltd., Tel Aviv, Israel

[21] Appl. No.: 751,587

[22] Filed: Nov. 18, 1996

[30] Foreign Application Priority Data

Nov. 21, 1995 [IL] Israel ......................................... 116087

[51] Int. Cl.$^6$ ................................................... H03H 13/00
[52] U.S. Cl. ................................... 371/37.01; 371/37.04; 371/37.06; 371/37.09
[58] Field of Search ............................. 371/37.01, 37.04, 371/37.06, 37.09

[56] References Cited

U.S. PATENT DOCUMENTS

| 4,731,799 | 3/1988 | Longstaff et al. | 375/39 |
| 4,933,956 | 6/1990 | Forney, Jr. | 375/94 |

OTHER PUBLICATIONS

Amrani, O. et al, "Efficient Bounded–Distance Decoding of the Hexacode and Associated Decoders for the Leech Lattice and the Golay Code", IEEE Transactions on Communications, vol. 44, No. 5, pp. 534–537 (May 1996).

Amrani, O. et al, "The Leech Lattice and the Golay Code: Bounded–Distance Decoding and Multilevel Constructions", IEEE Transactions on Information Theory, vol. 40, No. 4, pp. 1030–1043, Jul. 1994.

Blahut, R.E., "Theory and Practice of Error Control Codes" pp. 1–15.

Sklar, B., "Digital Communications: Fundamentals and Applications" pp. 269–273.

*Primary Examiner*—Stephen M. Baker
*Attorney, Agent, or Firm*—Mark M. Friedman

[57] ABSTRACT

A method for bounded distance decoding of symbols received in transmission when the original symbols belonged to a Block code featuring series of symbols forming legitimate codewords whose metric distance from the received transmission is measured in Square Euclidean Distance (SED), when the maximum number of errors per word is upward bound by d-1; in which the Block code can be divided into subsets which will each define the entire codeword; and in which the maximum number of errors in at least one subset is one. The method includes dividing the received symbols into a number of blocks per codeword and decoding each block separately and simultaneously with regard to a maximum of one error present in each block. The solution of the decoder is the legitimate codeword with the lowest overall metric distance (SED) from the received transmission.

7 Claims, 8 Drawing Sheets

Fig. 7

| Code | Rate | $\tilde{N}_D$ | $\gamma$ (dB) | $\gamma_{eff}$ (dB) |
|---|---|---|---|---|
| AB2 | $A_{24}$ | 1/2 | 44 | 6.02 | 4.00 |
| Eyuboglu | 2D 8 state | 1/2 | 44 | 3.52 | 3.32 |
| AB1 | $A_{24}$ | 1/2 | 60 | 6.02 | 4.10 |
| Calderbank-Sloane | 2D 8 state | 1/2 | 72 | 4.39 | 3.79 |
| ABVSvT[7] | $A_{24}$ | 1/2 | 84 | 6.02 | 4.10 |
| Eyuboglu | 2D 16 state | 1/2 | 128 | 4.77 | 4.37 |
| Vardy-Be'ery[6] | $A_{24}$ | 1/2 | 300 | 6.02 | 4.20 |
| AB2 | $H_{24}$ | 2/3 | 22 | 5.77 | 3.80 |
| AB1 | $H_{24}$ | 2/3 | 30 | 5.77 | 3.90 |
| Wei | 4D 8 state | 2/3 | 44 | 4.52 | 3.82 |
| Wei | 4D 16 state | 2/3 | 72 | 4.52 | 4.20 |
| Gallager-Calderbank-Sloane | 4D 8 state | 3/4 | 64 | 4.52 | 3.82 |
| Calderbank-Sloane | 8D 8 state | 3/4 | 90 | 5.27 | 3.75 |
| Wei | 8D 16 state | 3/4 | 104 | 5.27 | 4.01 |

METHODS FOR EFFICIENT BOUNDED-DISTANCE DECODING OF THE HEXACODE AND ASSOCIATED DECODERS FOR THE LEECH LATTICE AND THE GOLAY CODE

FIELD AND BACKGROUND OF THE INVENTION

The present invention relates to decoding algorithms which are used to recover information which has been distorted during transmission over practical memoryless Channels, and, more particularly, to a set of algorithms used for bounded- distance decoding of information which has been encoded using any one of a range of codes (to be defined later on), including the Leech Lattice, Golay, and Hexacode codes.

The problem of distortion in memoryless channels is important because of their widespread use. Most such channels can be modelled after Additive White Gaussian noise (AWGN) channels. We will therefore use this model to demonstrate the proposed method. There are several ways of dealing with the problem of distortion. The most direct way is the following: the distortion is of a certain magnitude. The interference to a signal is determined by the relation of the power of interference, to the power with which the signals were transmitted. The greater the ratio, the greater the resulting interference will be. The most direct way of minimizing the distortion is to reduce the ratio by increasing the power with which the signal is transmitted. The obvious problems with this approach are the increased cost incurred in sending a transmission at a higher voltage, and cases when a power increase is not possible, as with power limited channels.

In order to provide better performance while maintaining the same transmitted power, several encoding methods have been devised which facilitate recovery of the distorted data. The data is encoded before transmission in such a way that after a limited distortion the received data can be related only to a limited group of possible codewords by virtue of the fact that a greater distortion would have been necessary had the original transmission differed in more than the upward bound number of characters defined by the code, and by making use of an appropriate decoding algorithm.

Codes are typically a series of points on a graph. In Block codes (see below) a series of points constitutes a vector which defines a codeword. Points are referred to by their graph coordinates. The power of the communication signal corresponds to the values of those coordinates.

The most commonly used codes are Trellis codes. These are generally based on binary convolutional codes, meaning that they may consist of an infinite stream of bits. And unlike Block codes, a Trellis code sequence may consist of an infinite number of points. The popularity of these codes is the result of Viterbi's discovery that a basic structure is common to all Trellis codes and they may all be described using a Trellis diagram. Thus a general optimal decoder exists for all possible Trellis codes. As a result, a generic optimal Trellis decoder has been mass produced in the form of a small piece of hardware easily installed in an existing decoding apparatus. This affords Trellis codes a large degree of universality.

Block codes and Lattice codes on the other hand, do not have a general optimal decoder based on their block structure. Thus they have not been widely used. In addition, these codes, and particularly the Leech Lattice, have been viewed as requiring very complex algorithms for their decoding.

The Leech Lattice is a Lattice code; the Golay code and Hexacode are Block codes. This means that they consist of sequences, or blocks, of points. Each sequence of points constitutes a vector, and each vector corresponds to a given codeword. Until now several methods of decoding existed. For Block codes, maximum likelihood decoding existed in two ways: one method takes the entire received word and, using a table of all legitimate codewords, tries to match the received word with the legitimate word it resembles most. This is done because we assume that most likely the least amount of distortion occurred. Therefore we look to find the codeword which represents that word which would have to have undergone the least amount of distortion in order to have been transformed into the received word. We do this by taking the points received in the transmitted word and measuring the metric of the distance between them and each of the legitimate codewords. For AWGN channels, the metric is measured by taking the Square Euclidean Distance (SED) between the points of the received word and the points of the proposed legitimate codeword.

This method is optimal since (a) the codewords in these codes are selected by virtue of their distance from each other, and (b) this method factors in the sum of the distance of all the points in the codeword. However this method is not very useful because of the high number of operations (computations) necessary to find the codeword with the smallest SED between it and the received word.

The other existing method is to construct a Trellis diagram for the Block code and then decode using Viterbi decoding. Although this method is optimal (i.e. it produces the same results as the first method of maximum likelihood decoding), Viterbi decoding is not always efficient in terms of decoding complexity.

Both decoding methods exist for Lattice codes as well. However, Lattice codes usually consist of a large number of lattice points, and the large number of decoding computations necessary could render this method impractical.

In addition to the optimal decoding methods mentioned above, certain sub-optimal decoding methods exist for Block and Lattice codes. However, even these methods could require a large number of operations for complex codes.

There is thus a widely recognized need for, and it would be highly advantageous to have, an efficient decoding method for Block and Lattice codes, including the Leech Lattice and Golay codes. Particularly if, as will be shown, this method proves to be even more efficient than comparable Trellis decoders.

SUMMARY OF THE INVENTION

According to the present invention there is provided, for certain Block codes, a method of dividing up words received into smaller blocks such that the process of decoding is greatly expedited. This method provides a highly efficient, though not optimal, method of decoding. However, when the effective error rates for bounded distance decoders are compared to those of maximum likelihood decoding it will be found that the error rates are identical in the asymptotic case, and are near-optimal for practical signal to noise ratios. This is clearly demonstrated by the formula for calculating the error rate:

The error rate is the product of (a) the number of effective neighboring points ($N_{eff}$) and (b) a function of the minimum distance between neighboring points and the variance (or power) of the noise ($Q(x)$).

$$Q(\chi) = \frac{1}{\sqrt{2\pi}} \int_{\chi}^{\infty} e^{-t^2/2} dt$$

The error rate $P_e \cong N_{eff} * Q(d_{min}/2\sigma)$

Although the number of neighboring points is greater in bounded distance decoding than in maximum likelihood decoding, this difference is inconsequential when Q(x) approaches zero. Both the values for $d_{min}$ and $\sigma^2$ are the same regardless of the type of decoder used, thus Q(x) is the same for both decoders. In the asymptotic case $\sigma^2 \to 0$, thus Q(x) approaches zero; in practical signal to noise ratios Q(x) is very small too, rendering the error rate near-optimal in those cases.

The current invention offers a reduction in decoding complexity which, coupled with the near optimal performance in decoding described above, presents the most efficient decoding method existing to date.

According to further features in preferred embodiments of the invention described below, this method can greatly enhance the decoding of the Golay code.

According to another embodiment, this method can greatly enhance the decoding of the Leech Lattice code.

The present invention successfully addressed the shortcomings of the presently known configurations by providing a method by which a distortion resulting in a high incidence of errors can be decoded with the efficiency of a case involving only one error per Hexacode word. In the cases of the Golay and Leech Lattice codes, their decoding is expedited by the fact that their codewords consist of groups of Hexacode words further limited by additional factors particular to those codes.

The present invention discloses a novel approach to addressing a distorted code word by dividing up the said word into units which on the one hand maintain the uniqueness of the entire word, yet on the other hand limit the number of possible errors in at least one of these units.

The fundamental principle of the decoder can be summed up by the following three conditions:
  a. the maximum number of errors is less than the minimum hamming distance (d) of the code. This is a basic premise for any bounded distance decoder.
  b. the codeword can be defined by subsets of codeword symbols.
  c. the maximum number of errors in at least one of the subsets is one. Clearly, this principle can be extended to cases in which more than one error may occur in each subset (thus disregarding condition c.), since the maximum number of errors to be dealt with in each subset is still fewer than that of the entire word.

For instance, a distorted Hexacode word is received not matching a legitimate Hexacode word. Assuming the distortion was such that it could not have generated more than three errors in the current word, the word is still unique enough to be identified. This is because in the Hexacode, legitimate codewords are distinguished from each other by at least three of the six symbols which comprise the word. Therefore, having maintained at least three of the original symbols will suffice to identify the original word. The received word is broken into two blocks of three symbols each. With a maximum of three errors affecting the entire word, at least one of the blocks will contain not more than one error. The entire array of possibilities for the Hexacode-word are generated, producing a total of ten possibilities for each block (nine possible variations on the received block, plus the received block itself). Taking both blocks into consideration results in a total of twenty possibilities to be considered. These possible codewords are systematically considered and the overall metric distance from the received word is calculated for each codeword. The series with the smallest metric overall is the original Hexacode word. The computational complexity of this algorithm is at most 107 real operations.

According to yet a further embodiment of the invention below, the location of the symbol in error is described, further reducing the number of operations necessary for decoding. The least reliable symbol in each block is the symbol with the highest metric. This is true by virtue of a lemma which can be proved. [Proof: Let the metric $m_1$ be the metric of the symbol in error. The noise energy added to the symbol in error $(x_1)$ satisfies $E_1 >= (2d-m_1)^2$ where 2d is the minimum Euclidean distance between symbols. Let $m_2$ be the metric of the second symbol, which is not in error. Thus the noise energy added to the second symbol $(x_2)$ satisfies $E_2 = m_2^2$. Since it is given that the noise energy added to the block satisfies $E_1 + E_2 < 2d^2$ (Recall that the magnitude of the noise is upper bounded by $4d^2$ in order to limit the number of possible errors to a maximum of three for the entire Hexacode word. Thus the maximum possible magnitude of noise in the block least affected by the noise is half of that: $2d^2$.), then $(2d-m_1)^2 + m_2^2 < 2d^2$. Adding $m_1$ to both sides in the last inequality results in $m_1^2 - m_2^2 > 2(m_1-d)^2$. Thus obviously $m_1^2 - m_2^2 > 0$, and $m_1^2 > m_2^2$.] This results in reducing the number of necessary real operations in the case of the Hexacode to 57.

More specifically, the present invention makes use of qualities inherent in the construction of the Hexacode to greatly reduce decoding complexity. For instance, the fact that all legitimate Hexacode words are differentiated by at least three of the six symbols comprising the Hexacode word. Also, the fact that Hexacode words can be divided into two blocks which can each define the Hexacode word. These qualities are present in many other block codes.

Regarding the Golay code, this is a 24-bit binary code. Each series of four bits defines a GF(4) symbol (the Hexacode has a total of four possible symbols for each position $\{0, 1, \omega, \overline{\omega}\}$). Thus the twenty-four bits can be converted into six series of four bits, each series describing a GF(4) symbol. The code is bound by the following conditions:
  1. the modulo 2 sums of each of the four-bit series of bits must be either all even, or all odd.
  2. taking the first bit in each series and adding the six of these together as a modulo 2 sum, must result in the same type of sum as each of the series (i.e. if the sums of condition 1 are even, this sum must be even too; if the sums are all odd, this sum must be odd.). This is known as h-parity (because the first position is known as the h position).
  3. taken together, the group of six GF(4) symbols described by the Golay code, must form a legitimate Hexacode word.

In decoding, two groups of possible symbols are drawn up: one whose column sums are even and one whose column sums are odd. From among each group, the Hexacode word with the lowest metric is derived. This is the preferred word from each group. h-parity is sought to satisfy the final condition of the Golay code. The Hexacode word with the lowest overall metric to satisfy this final condition is selected as the original transmission.

In the Leech Lattice code 12 points are plotted upon the QAM matrix forming the Leech Lattice vector. The QAM points are transmitted using voltage to describe the x and y coordinates. For purposes of illustration only, let us take the 64 QAM constellation. This would be divided into two groups of 32 points each, A and B respectively. Each of the 32 points are labeled using three binary bits (a total of only eight possible definitions), thus each description is common to four different points. Two additional bits are added to describe which of the four points is actually intended. Thus the Leech Lattice vector has 12 labels, for the 12 points of the vector, of three bits, i, j, k.

1. i,j,k must be either all points of A or all points of B.
2. All i's and j's taken together (24 characters in all) must form a Golay codeword.
3. All k's taken together must form yet another code word based on a single parity check code.

When a code vector is received 12 distorted points are received. The legitimate vector with the nearest Square Euclidean Distance to the received vector is the correct original vector when the distortion is bounded by the limits of bounded distance decoding. This is due to the fact that Gaussian Noise is additive to the original signal.

Based on condition 1. all vectors consisting only of points belonging to A are selected. For each of the possible eight labels, the closest of the four points sharing that label is chosen. The sequence of i,j for the 12 points is decoded based on the Golay code. This step is carried out in it's most efficient form, as a decoding of the Hexacode ($I_1$, $j_1$, $I_2$, $j_2$ define a GF(4) symbol. Thus through $I_{11}$, $j_{11}$,$I_{12}$,$j_{12}$, six GF(4) symbols are described) (see previous section). The same is carried out for all vectors consisting of points belonging to B. The final step is to decode the sequence of k for all possible k defined by the previous steps of the decoder, based on the single parity code of k, resulting in the selection of the vector with the lowest metric to satisfy all of the Leech Lattice conditions.

Maximum likelihood decoding requires 3,595 real operations; the proposed method of bounded distance decoding requires only 719 real operations using algorithm 1 and 519 real operations using algorithm 2. The increase in error rate in interpretation can be compensated for by an increment of only 0. 1dB in the power of transmission for algorithm 1, and 0.2dB for algorithm 2 (see graphs in FIGS. 5 and 6).

Another instructive comparison is between Leech Lattice codes and the best known Trellis codes shown in FIG. 7. The chart shows that using the same number of operations in both codes results in a greater coding gain for the Leech Lattice, and that in order to obtain the same coding gain less operations are required.

BRIEF DESCRIPTION OF THE DRAWINGS

The invention is herein described, by way of example only, with reference to the accompanying drawings, wherein:

FIG. 7 is a chart comparing the Leech Lattice decoders to the best known Trellis codes.

DESCRIPTION OF THE PREFERRED EMBODIMENTS

The present invention is of a bounded distance decoder for the family of block codes described herein that can be used to improve decoding for more complex codes, including the Leech Lattice and Golay codes.

Specifically, the present invention can be used to enhance the performance of the Golay, the Leech Lattice, and other codes, affording both coding gain and reduction in complexity of decoding, while maintaining a low error rate. A similar coding gain would involve a much greater complexity when employing either Trellis codes, or maximum likelihood decoding of the Leech Lattice and Golay codes.

The principles and operation of the decoding algorithms proposed herein may be better understood with reference to the drawings and the accompanying description.

Figure 1:
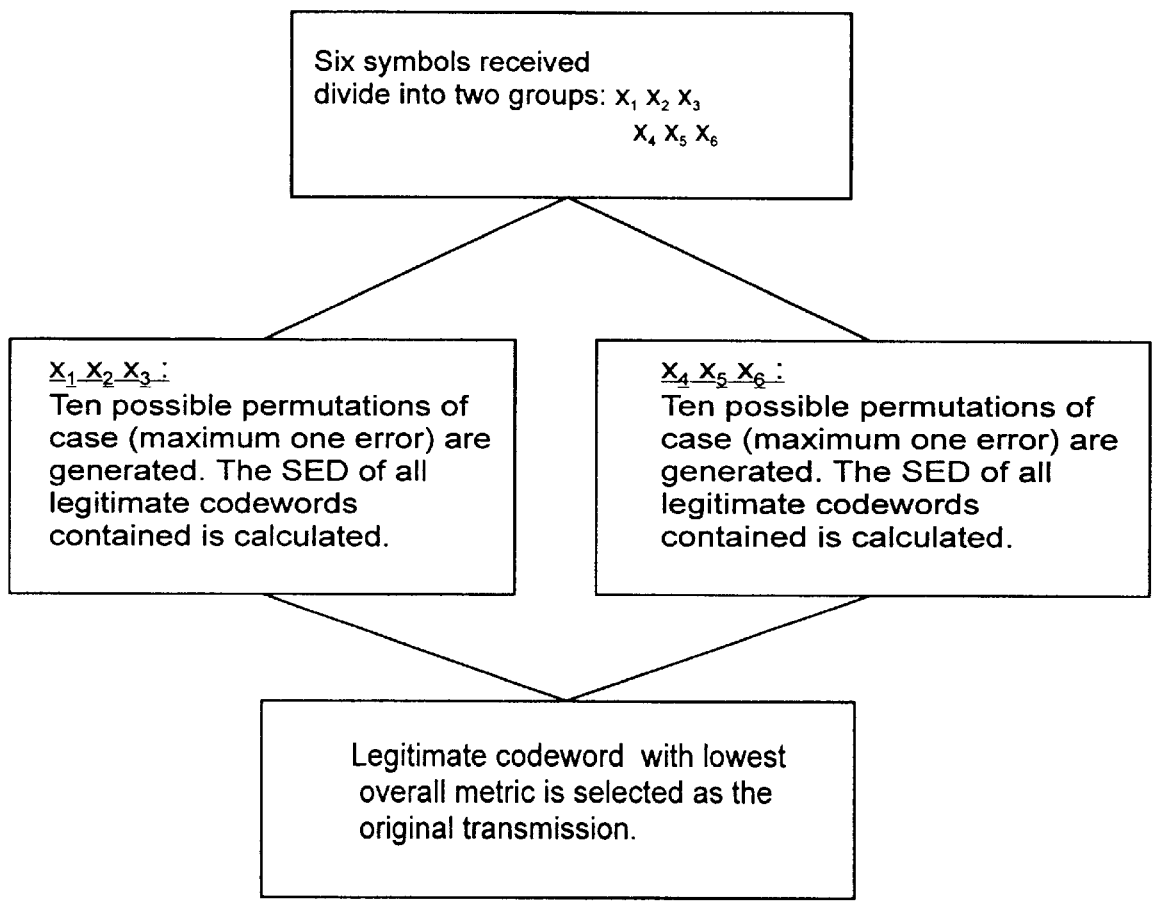
FIG. 1 is a flow diagram of the proposed decoder for the Hexacode in its most fundamental form.

Referring now to the drawings, FIG. 1 illustrates the basic concept of the decoding algorithm. While maintaining a high possible amount of tolerable distortion, the algorithm enables limiting the search for the appropriate symbol to only a handful of options. The received symbols are divided into two groups. Because the distortion has been upward bound to $4d^2$, such that the maximum number of errors can be not more than three, the number of symbols in error in the block with the fewest errors cannot be greater than one. Therefore only one symbol need be suspected at a time severely limiting the number of possible codewords. Compare this to maximum likelihood decoding which considers the entire codeword at once, hence the number of possible codewords would be far greater.

Figure 2:
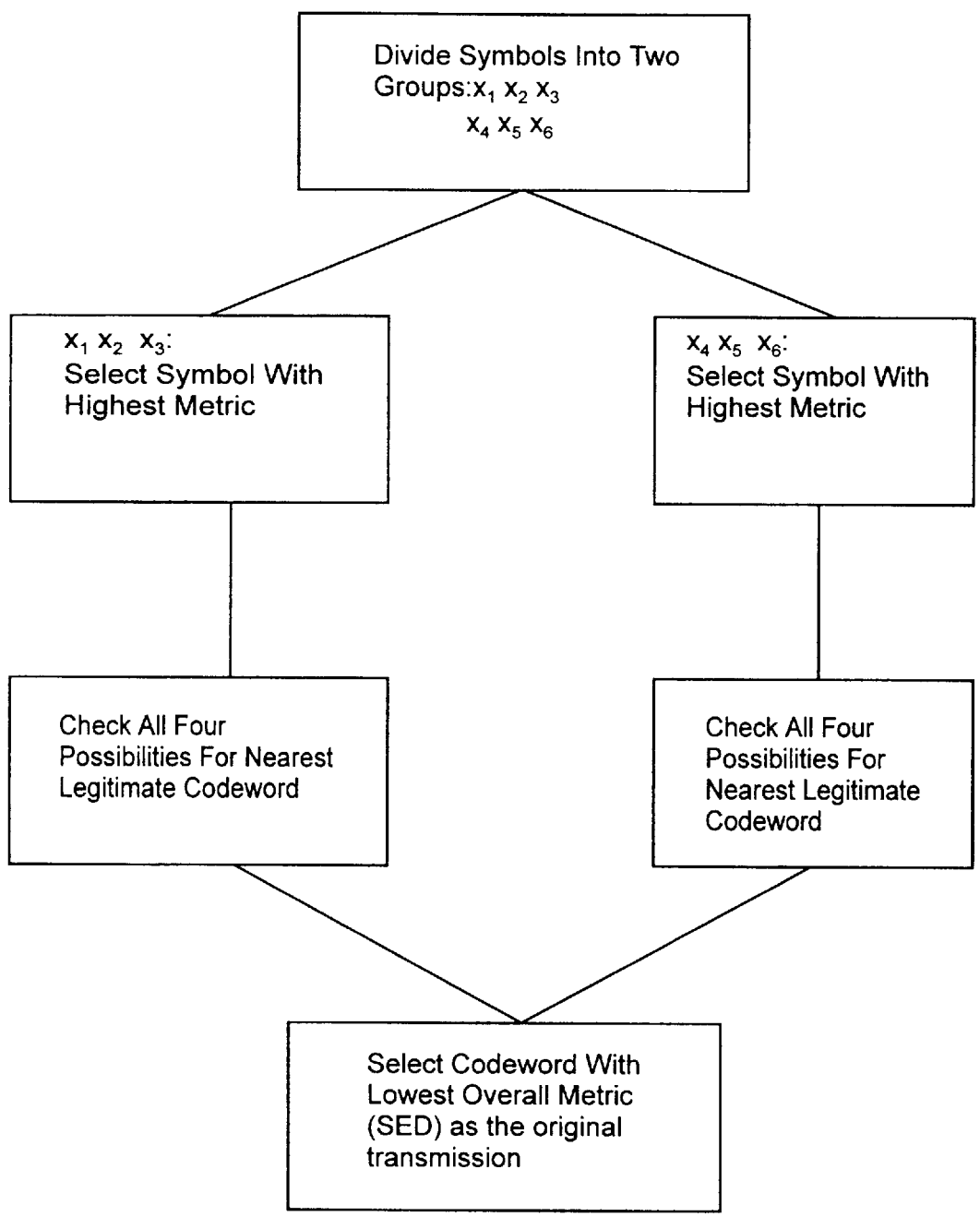
FIG. 2 is a flow diagram of an enhancement to the proposed decoder for further reduction in decoding complexity.

Another possible configuration is shown in FIG. 2 in which the number of possible codewords falling under consideration is reduced still further by virtue of a lemma that states that the distorted symbol will be the one with the highest metric of the group. The most suspect symbol from each group is located and the search is limited to only the various codewords afforded by manipulating those positions in each of the blocks independently.

Figure 3:
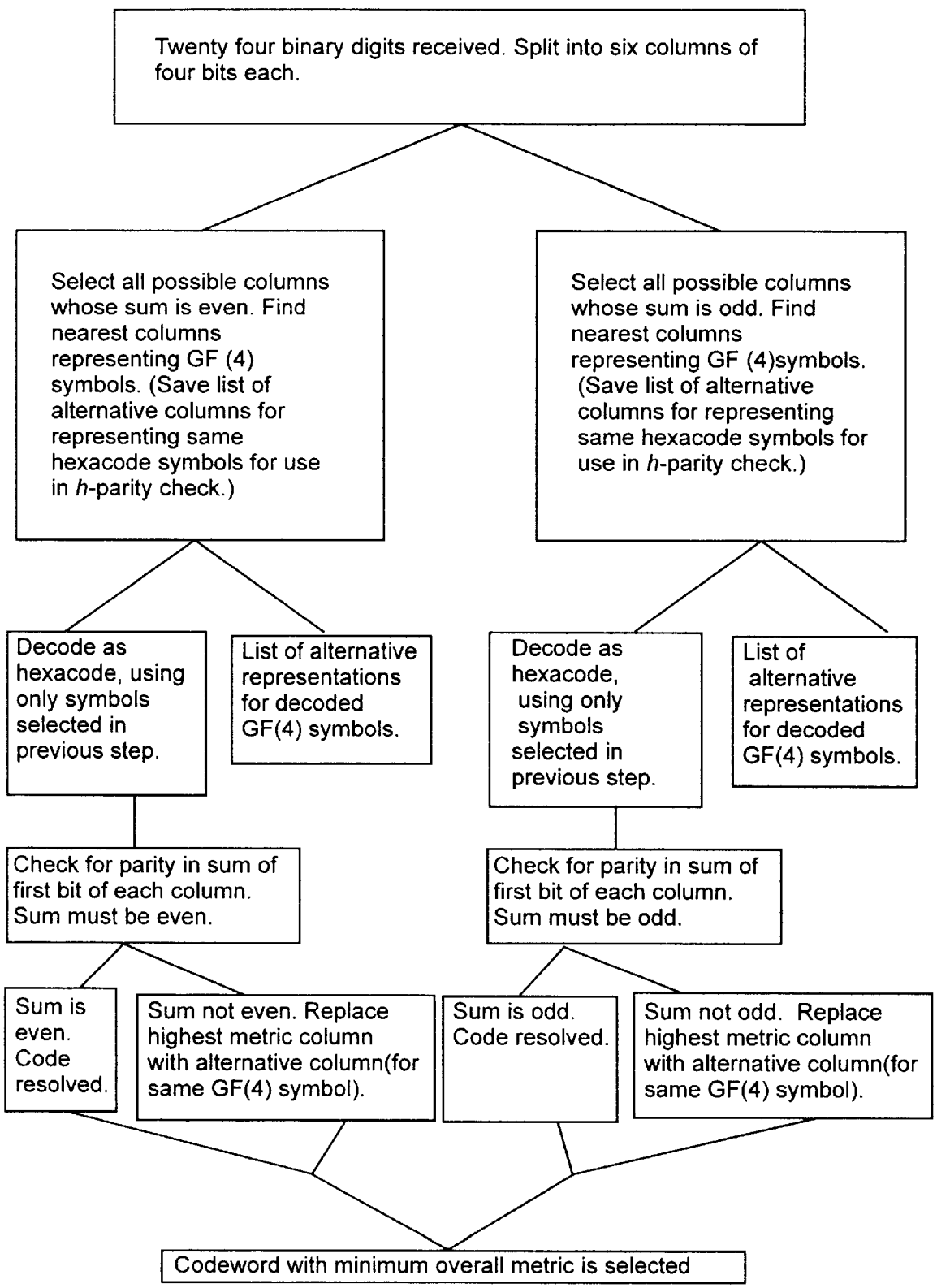
FIG. 3 is a flow diagram of the proposed decoder for the Golay code demonstrating the incorporation of the Hexacode decoder therein.

FIG. 3 illustrates the application of the Hexacode decoder in the Golay code. The Golay codes' three conditions are reconstructed in the process of decoding as can be seen in the flow diagram. The first, that the sums of all four-symbol sequences (referred to as columns) in each Golay codeword must be either all odd or all even, is accomplished by using only even representations for each GF(4) symbol, and in parallel using only odd representations. Decoding of the hexacode is carried out in parallel on both groups. Next, the decoded four symbol columns are reconstructed while maintaining a sequence of the most likely symbol sequences. Finally, those codewords are tested for h-parity (the sum of the first symbol in each of the columns must be either odd or even-whichever the sum of each of the columns is for that codeword). The codeword thus satisfying with the lowest metric overall is the product of the decoder.

Figure 4:
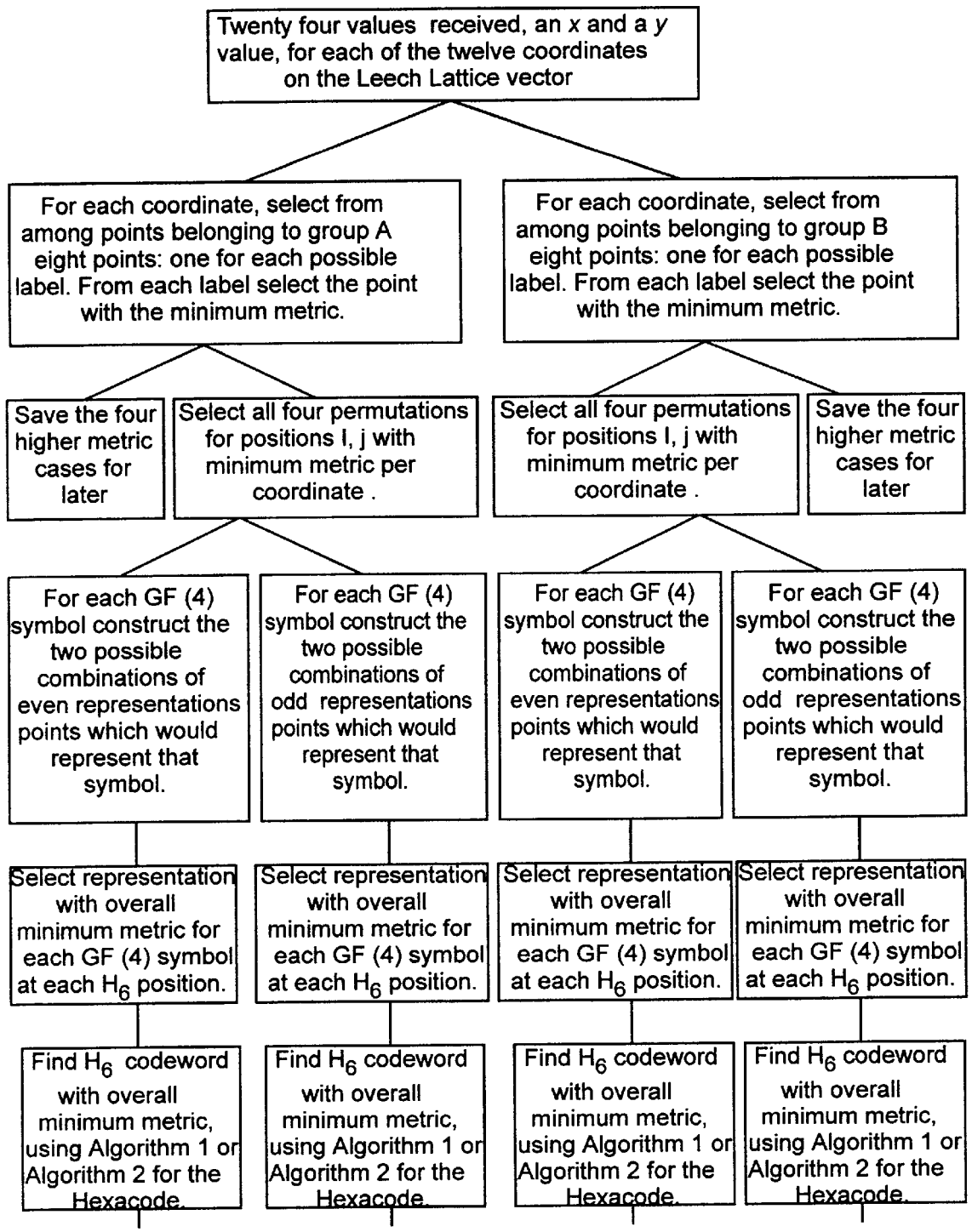
FIGS. 4A and 4B are a flow diagram of the proposed decoder for the Leech Lattice code demonstrating the incorporation of the proposed Hexacode decoder.
Figure 4:
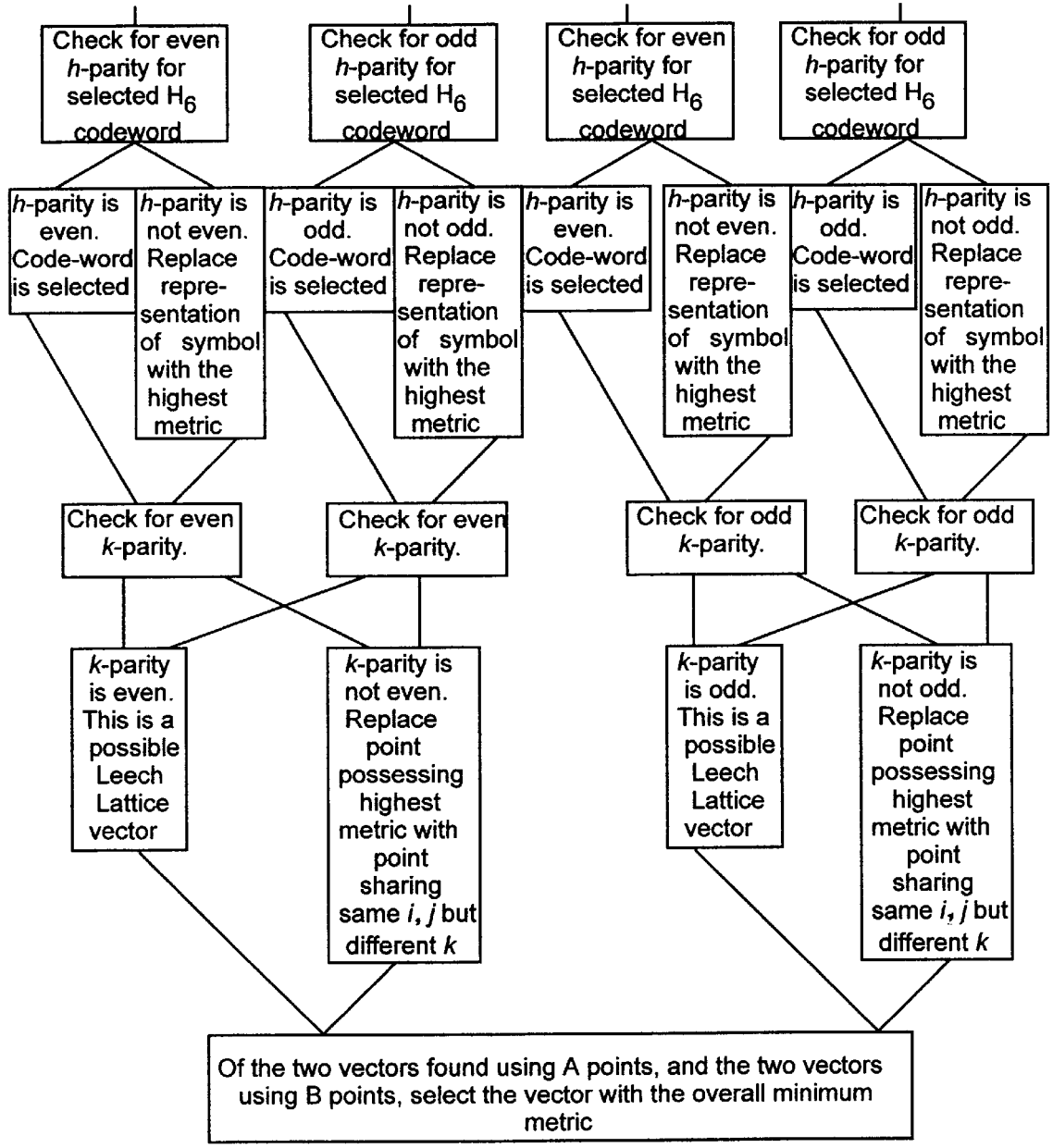
Figure 5:
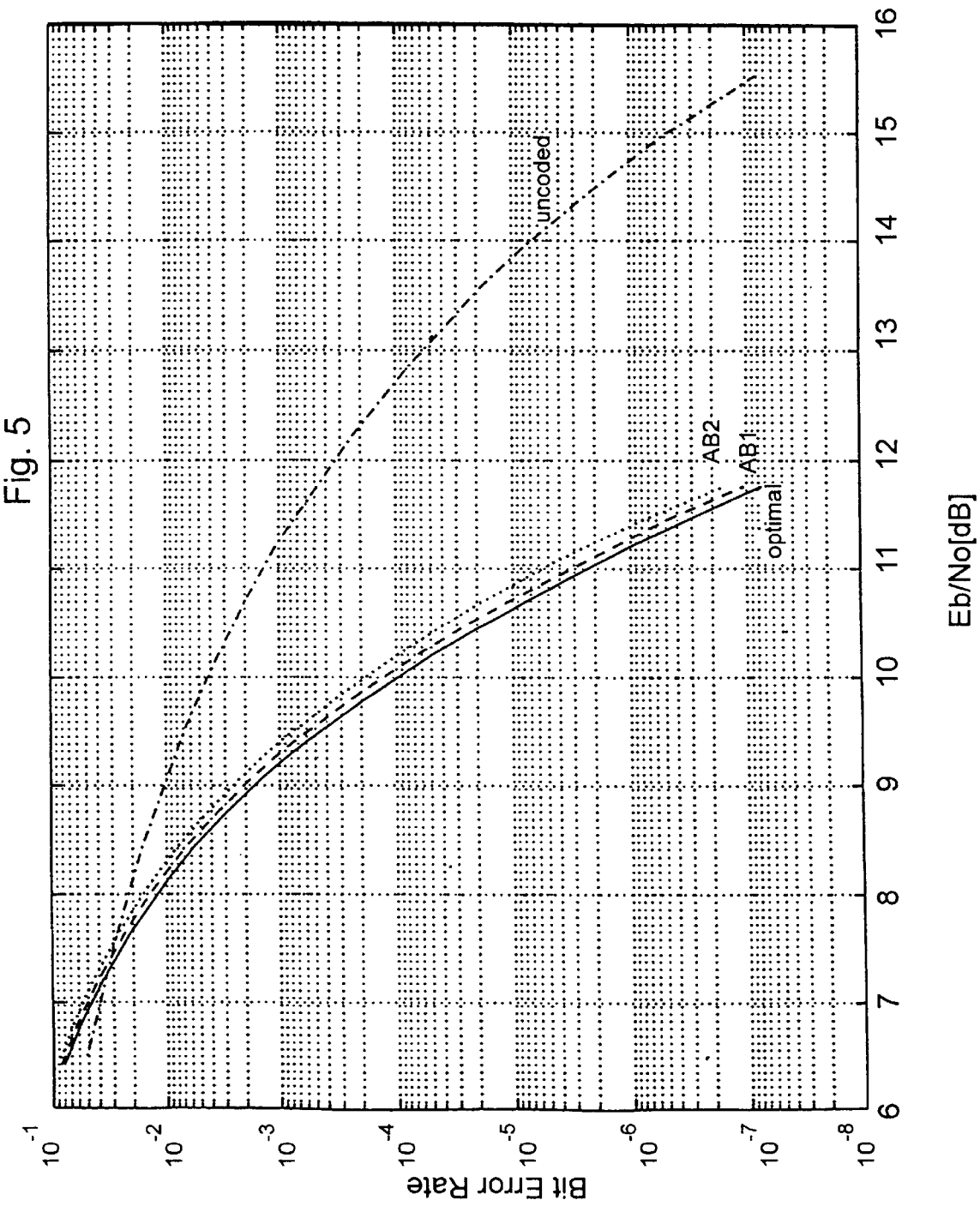
FIG. 5 is a graph describing the bit error rate for the two Leech Lattice decoders vs. optimal (maximum likelihood) decoding.
Figure 6:
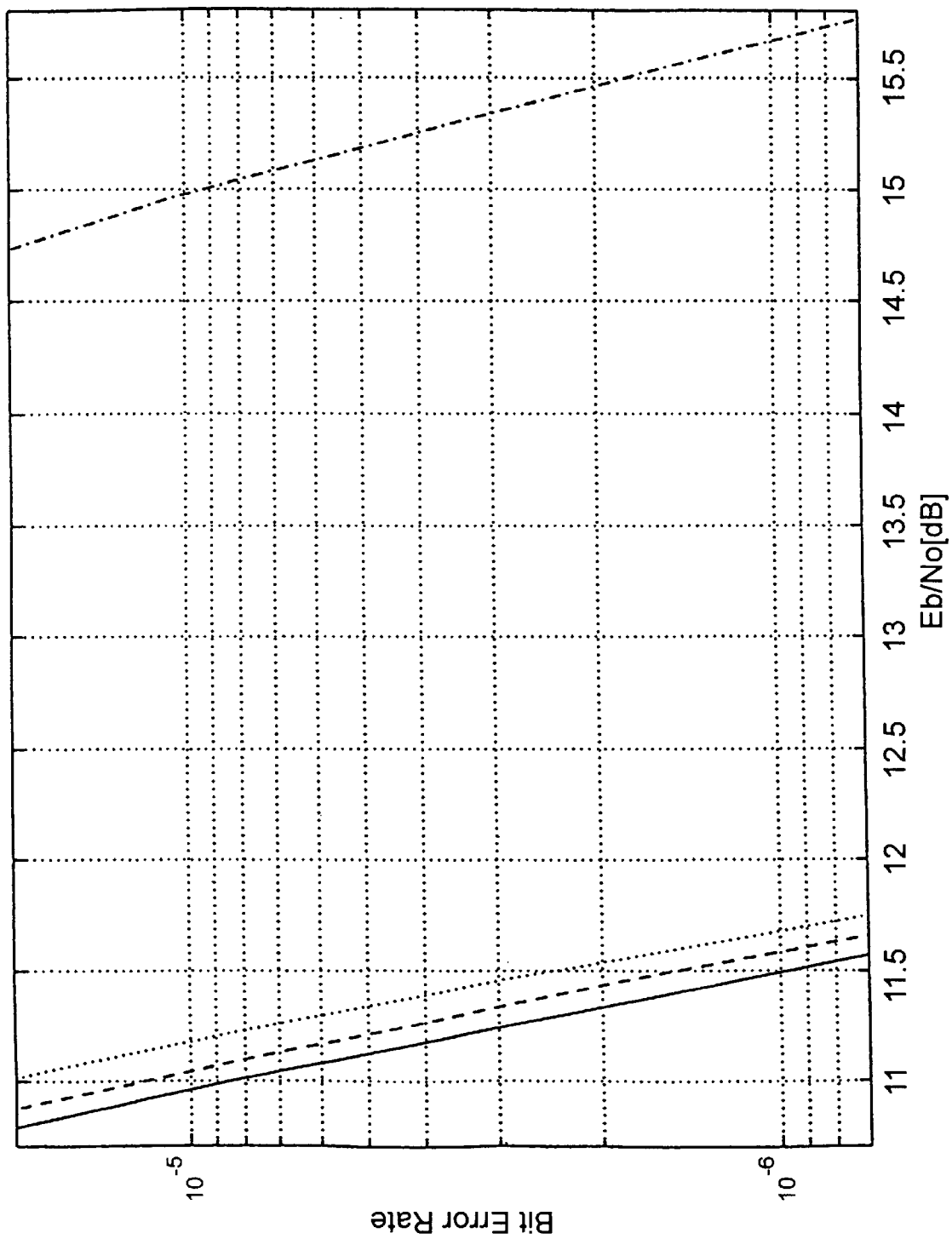
FIG. 6 is a graph describing the word error rate for the two Leech Lattice decoders vs. optimal (maximum likelihood) decoding.

FIG. 4 illustrates the decoder for the Leech Lattice code. The received values describing each point on the Leech Lattice vector are used to describe two sets of points: points belonging to the A group and points belonging to the B group. This is based upon the first condition of the Leech Lattice code that all vector points must belong to either the A or B group. These two groups divide the matrix in checkerboard fashion with one group labeled A (for instance, what correspond to the black checkerboard squares) and the other labeled B (for instance, what would correspond to the white squares). In the 64 QAM, A and B consist of 32 points each. From this point on, the steps described are carried out in parallel for both the A points and the B points. Each coordinate has a label (listed in a table) consisting of three bits. Thus with eight possible labels, each label is common to four points. [Two more bits are added to distinguish these points from each other.] For every coordinate on the vector, a point for each label is selected- the point with the lowest metric for that label. Thus a total of eight possible points is selected for each coordinate.

The next condition of the Leech Lattice code is that the first two binary bits in each label put together, form a Golay codeword. For each two bit combination there exist two points differentiated by their third bit. For each two bit combination, the point with the lowest metric is selected. However, the other points are stored as well, in case a later condition regarding the third point cannot be filled by the point selected at this stage.

Using these points, the metric of the various GF(4) symbols is computed for all six $H_6$ positions. Next, the Hexacode word with the minimum overall metric is selected using either algorithm 1 or algorithm 2 for decoding the Hexacode.

h-parity is checked, and corrected if necessary.

k-parity is checked and corrected if necessary.

Of the four Leech Lattice codewords generated, the codeword with the overall minimum metric is selected.

While the invention has been described with respect to a limited number of embodiments, it will be appreciated that many variations, modifications and other applications of the invention may be made.

What is claimed is:

1. A method for bounded distance decoding of symbols received in transmission when the original symbols belonged to a Block code featuring series of symbols forming legitimate codewords whose metric distance from the received transmission is measured in Square Euclidean Distance (SED), when the maximum number of errors per word is upward bound by d-1; in which the Block code can be divided into subsets which will each define the entire codeword; and in which the maximum number of errors in at least one subset is one, comprising:

(a) dividing the received symbols into a number of blocks per codeword; and (b) decoding each block separately and simultaneously with regard to a maximum of one error present in each block; the solution of the decoder being the legitimate codeword with the lowest overall metric distance (SED) from the received transmission.

2. A method for bounded distance decoding of symbols received in transmission when the original symbols belonged to the Hexacode which features series of symbols forming legitimate Hexacode words whose distance from the received transmission is measured in Square Euclidean Distance (SED), when the maximum error rate is three symbols per Hexacode word, comprising:

(a) dividing received symbols into two blocks per hexacode word; and (b) decoding each block separately simultaneously with regard to a maximum of one error present in each block; the solution of the decoder being the legitimate codeword with the lowest overall metric distance (SED) from the received transmission.

3. A method as in claim 2, further comprising, prior to decoding the codeword blocks, revealing the position of the symbol in error in each block based on a lemma stating that the symbol in error is contained in the position with the highest metric.

4. A method for bounded distance decoding of the Golay code employing the methods described in claim 2 at the point in decoding in which the 24-bit Golay codeword has been converted into a Hexacode word.

5. A method for bounded distance decoding of the Golay code employing the methods described in claim 3 at the point in decoding in which the 24-bit Golay codeword has been converted into a Hexacode word.

6. A method for bounded distance decoding of the Leech Lattice code employing the methods described in claim 2 at the point at which the Hexacode is decoded.

7. A method for bounded distance decoding of the Leech Lattice code employing the methods described in claim 3 at the point at which the Hexacode is decoded.

* * * * *